(12) United States Patent
Maccarrone et al.

(10) Patent No.: US 9,281,064 B2
(45) Date of Patent: Mar. 8, 2016

(54) FAST PROGRAMMING MEMORY DEVICE

(71) Applicant: Micron Technology, Inc., Boise, ID (US)

(72) Inventors: Marco Maccarrone, Palestro (IT); Giuseppe Giannini, Monza (IT); Demetrio Pellicone, Castrolibero (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/632,791

(22) Filed: Feb. 26, 2015

(65) Prior Publication Data

US 2015/0170745 A1 Jun. 18, 2015

Related U.S. Application Data

(60) Continuation of application No. 14/076,971, filed on Nov. 11, 2013, now Pat. No. 8,982,627, which is a division of application No. 13/155,347, filed on Jun. 7, 2011, now Pat. No. 8,582,364, which is a division of application No. 12/123,359, filed on May 19, 2008, now Pat. No. 8,018,771.

(30) Foreign Application Priority Data

May 18, 2007 (IT) .................. MI07A1012

(51) Int. Cl.
| | |
|---|---|
| *G11C 16/04* | (2006.01) |
| *G11C 16/10* | (2006.01) |
| *G11C 16/14* | (2006.01) |
| *G11C 16/26* | (2006.01) |
| *G11C 16/28* | (2006.01) |
| *G11C 16/30* | (2006.01) |

(52) U.S. Cl.
CPC ............ *G11C 16/0483* (2013.01); *G11C 16/10* (2013.01); *G11C 16/14* (2013.01); *G11C 16/26* (2013.01); *G11C 16/28* (2013.01); *G11C 16/30* (2013.01)

(58) Field of Classification Search
CPC .. G11C 16/10; G11C 11/5635; G11C 27/005; G11C 13/0064
See application file for complete search history.

(56) References Cited

U.S. PATENT DOCUMENTS

| | | | | | |
|---|---|---|---|---|---|
| 5,487,036 | A * | 1/1996 | Akaogi | ................... | G11C 29/04 365/185.08 |
| 5,761,122 | A * | 6/1998 | Nakamura | ............... | G11C 7/00 365/185.21 |
| 6,456,528 | B1 * | 9/2002 | Chen | ....................... | G11C 11/56 365/185.03 |
| 6,608,776 | B2 * | 8/2003 | Hidaka | ................... | B82Y 10/00 365/171 |
| 7,031,214 | B2 * | 4/2006 | Tran | .................... | G11C 11/5621 365/185.11 |
| 7,164,602 | B2 | 1/2007 | Hamamoto et al. | | |

(Continued)

*Primary Examiner* — Tuan T Nguyen
(74) *Attorney, Agent, or Firm* — Schwegman Lundberg & Woessner, P.A.

(57) ABSTRACT

In an embodiment of a memory device including a matrix of memory cells wherein the memory cells are arranged in a plurality of memory cells strings each one including at least two serially-connected memory cells, groups of at least two memory cells strings being connected to a respective bit line, and wherein said memory cells are adapted to be programmed into at least a first programming state and a second programming state, a method of storing data comprising exploiting a single memory cell for each of the memory cells string for writing the data, wherein said exploiting includes bringing the single memory cell to the second programming state, the remaining memory cells of the string being left in the first programming state.

20 Claims, 4 Drawing Sheets

(56) References Cited

U.S. PATENT DOCUMENTS

| | | |
|---|---|---|
| 7,362,616 B2 | 4/2008 | Bovino et al. |
| 7,403,423 B2 | 7/2008 | Marotta et al. |
| 7,508,714 B2 | 3/2009 | Fasoli |
| 7,710,778 B2 | 5/2010 | Beltrami et al. |
| 8,018,771 B2 | 9/2011 | Maccarrone et al. |
| 8,238,158 B2 | 8/2012 | Shelton et al. |
| 8,582,364 B2 | 11/2013 | Maccarrone et al. |
| 2007/0030730 A1 | 2/2007 | Bovino et al. |
| 2007/0109864 A1* | 5/2007 | Chen ............... G11C 11/56 365/185.21 |
| 2007/0109876 A1* | 5/2007 | Umezawa ........... G11C 5/145 365/189.09 |
| 2007/0242511 A1 | 10/2007 | Chen et al. |
| 2011/0235411 A1 | 9/2011 | Maccarrone et al. |
| 2011/0267883 A1* | 11/2011 | Lee ................. G11C 16/045 365/185.08 |
| 2012/0033491 A1 | 2/2012 | Shelton et al. |
| 2014/0071767 A1 | 3/2014 | Maccarrone et al. |

\* cited by examiner

FAST PROGRAMMING MEMORY DEVICE

PRIORITY CLAIM

This application claims priority from Italian patent application No. MI2007A001012, filed May 18, 2007, which is incorporated herein by reference.

TECHNICAL FIELD

An embodiment of the present invention relates to the electronics field. More specifically, an embodiment of the present invention relates to electronic systems employing memory devices.

BACKGROUND

In a number of electronic systems, the memory devices are used to store recovery data necessary for restoring a working environment in case the power supply goes down.

For example, when the power supply is cut off abruptly in a computer (due to an interruption of the electric power or any mistake of the user), recovery data have to be stored in the memory devices just before the power down, so that when the power supply is applied again to the computer, the working environment related to the former state preceding the power down is restored using the recovery data. Such operation is also called a "hibernation operation".

Typically, non-volatile memory devices (such as conventional flash or EEPROM memories) are employed for storing the recovery data during the hibernation operation. The data are safely saved by programming the non-volatile memory devices, and the programmed data are preserved even when the memory device power supply is off.

Unfortunately, the program operation of flash or EEPROM memories may require a significantly long time, so that these memories may be unsuitable for applications where the hibernation operation has to be performed in a very short time (ranging for example from 50 μs to 500 μs).

In more detail, the flash memory devices are electrically-programmable, non-volatile memories, with memory cells consisting of a floating-gate MOS transistor, which stores a logic value defined by its threshold voltage (which depends on the electric charge stored on the floating gate). In particular, during the programming operation of the floating-gate MOS transistor electrons are injected, for example by means of the known Fowler-Nordheim tunneling mechanism, into the floating gate; the retention of such electrons by the floating gate guarantees the memory device non-volatility. Vice versa, during the erasing operation, the floating gate is substantially emptied of the electrons, which were injected during the programming.

In a flash memory, every single memory cell may be programmed individually, but memory cells cannot be individually erased: a large number of memory cells, forming a so-called "memory sector", are erased at the same time.

In a flash memory device with NAND architecture, which ensures a high degree of compactness, the memory cells are grouped in strings, each one consisting of a group of memory cells that are connected in series between a drain select transistor, connected to a bit line, and a source select transistor, connected to a reference voltage distribution line distributing a reference voltage (such as a ground voltage); groups of said strings of memory cells are connected to a same bit line, and thus they are connected in parallel to each other.

Memory cells are programmed by repeatedly applying thereto programming voltage pulses.

During a reading operation, the select lines of the string including the selected memory cell to be read are brought to the supply voltage. The word line of the selected memory cell is brought to a read voltage which is intermediate between the threshold voltage range corresponding to the "1" state and the threshold voltage range corresponding to the "0" state; for example, the read voltage may be equal to the reference voltage (0V). The other word lines, to which the other memory cells of the string belong, are brought to a passing voltage Vpass having a value (for example, 4.5V) sufficiently high to ensure that the memory cells connected thereto are rendered conductive irrespective of their threshold voltage, i.e. irrespective of the fact that they are programmed or not.

Thus, by using the reference voltage as a reading voltage value, the selected memory cell of the string will be conductive if its threshold voltage is lower than the gate-source voltage applied thereto, and not conductive otherwise; this allows discriminating the data stored in the memory cells.

In order to ensure that all the other memory cells of string, other than the selected memory cell, are conductive, the passing voltage Vpass is chosen sufficiently higher than the expected maximum threshold voltage of the memory cells of the string. If even one memory cell happens to have a threshold voltage higher than the expected maximum threshold voltage, the latter may remain non-conductive when the passing voltage Vpass is applied thereto, and this causes errors of the read logic value.

Such problem may be magnified by the fact that during each reading operation, spurious hot carrier generation occurs that cause soft programming of the unselected memory cells. In such case, the threshold voltage of some memory cells may become higher that the expected maximum threshold voltage, so that even applying thereto the passing voltage Vpass those memory cells do not turn on, causing reading errors.

For limiting the occurrence of these problems, the width of the statistical distribution of the threshold voltages of the programmed cells should be tightly controlled, so that the threshold voltage varies in a quite narrow range of values (for example, 3V). In order to ensure that the width of the memory cells threshold voltages distribution remains within the desired range, several verify operations are to be performed, after each programming pulse. The need to apply several programming pulses and to perform several program verify lengthens the time required for programming the memory.

SUMMARY

According to an embodiment of the present invention, a reduced number of memory cells are used, for example in an hibernation operation, for storing the recovering data to be exploited when the power supply returns for recovering the system operating state before the power supply powers down.

An embodiment of the present invention proposes a method of storing data in a memory device including a matrix of memory cells having a NAND architecture. The memory cells are arranged in a plurality of memory cells strings each one including at least two serially-connected memory cells, groups of memory cells strings are connected to respective bit lines; said memory cells are adapted to be programmed into at least a first programming state and a second programming state. A method of storing data comprises: exploiting only one memory cell for each of the memory cells strings connected to a same bit line for writing the data, wherein said exploiting includes bringing the memory cell to the second programming state, the remaining memory cells of the string being left in the first programming state.

BRIEF DESCRIPTION OF THE DRAWINGS

These and other features and advantages will be made apparent by the following detailed description of one or more embodiments of the invention, provided merely by way of non-limitative example, description that will be conducted making reference to the attached drawings, wherein.

DETAILED DESCRIPTION

Figure 1:
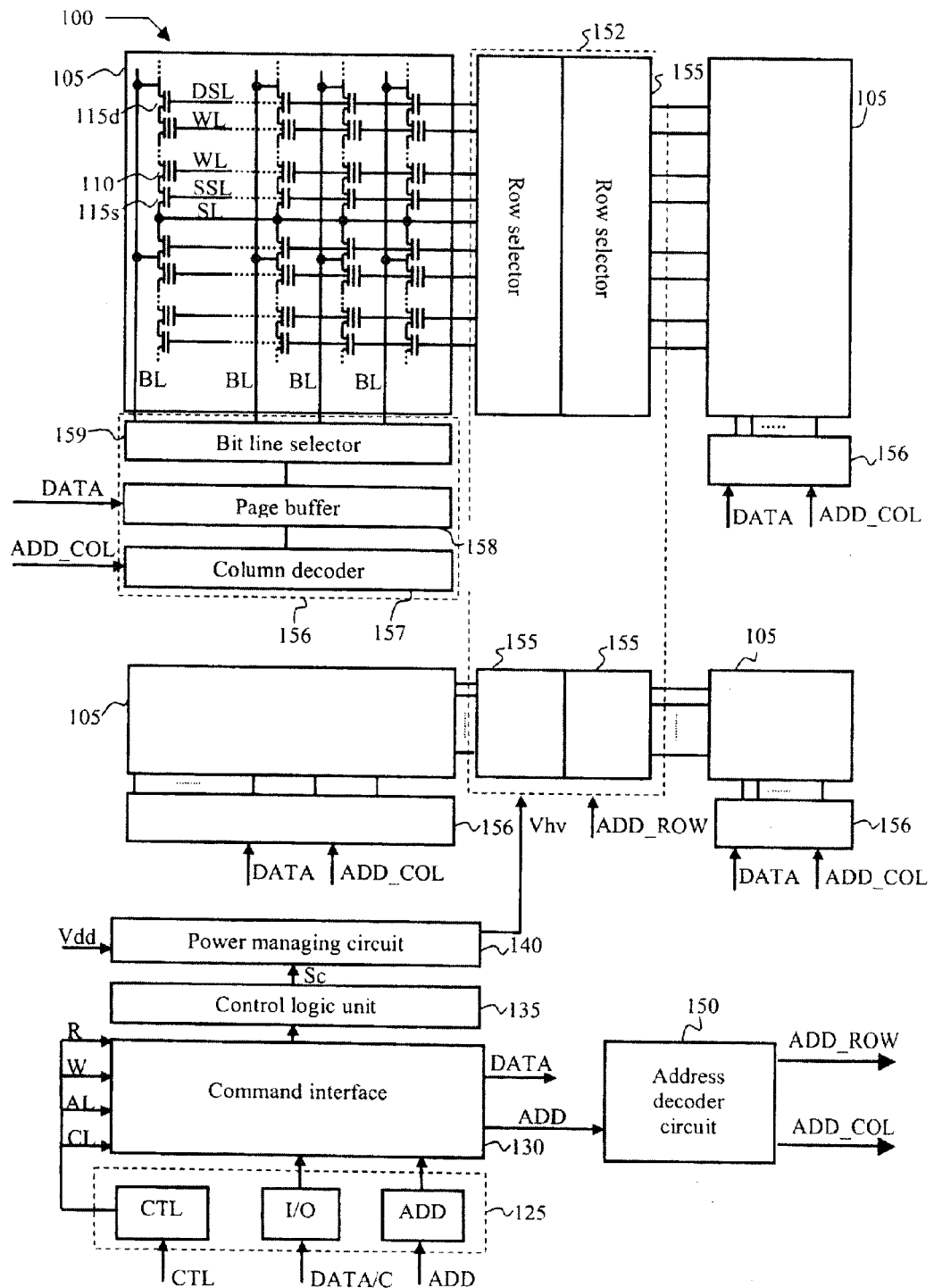
FIG. 1 schematically shows a block diagram of a semiconductor memory device according to an embodiment of the present invention.

Throughout the following description, identical or similar elements in the drawings are denoted by same reference numerals.

With reference to the drawings, in FIG. 1 a non-volatile semiconductor memory device 100 is illustrated, particularly an electrically programmable, non-volatile semiconductor memory, for example a flash memory.

The semiconductor memory device 100 is integrated in a chip of semiconductor material, and includes a plurality of memory sectors 105. The generic memory sector 105 is erasable individually, independently from the other memory sectors; each memory sector 105 comprises a plurality of memory cells 110, arranged in a plurality of rows and a plurality of columns, and which when the memory sector 105 is erased are all erased at the same time.

Typically, each memory cell 110 consists of an n-channel MOS transistor having a charge-storage element, such as a conductive floating gate adapted to be charged by electrons injected into it. In an erased condition (associated by convention with the logic value "1"), the memory cell 110 has a low (negative compared to a reference voltage, like the ground, taken as the zero voltage) threshold voltage value whereas in the programmed condition (associated by convention with the logic value "0"), the memory cell 110 has a high (positive) threshold voltage value. For reading the content of a selected memory cell 110, the cell is biased so as to be conductive if it is erased, or non-conductive if it is programmed.

The semiconductor memory device 100 has NAND architecture: in each sector 105, groups of, for example, eight or sixteen, memory cells 110 are connected in series to each other to form a respective memory cells string, and different memory cells strings belonging to a same column of the memory sector 105 are connected in parallel to each other to a same bit line BL.

The memory cells 110 of a generic string are in particular connected in series between a source select n-channel MOS transistor 115s and a drain select n-channel MOS transistor 115d. A generic, intermediate memory cell 110 in the memory cells string has the drain terminal connected to the source terminal of an adjacent memory cell 110, and the source terminal connected to the drain terminal of another adjacent memory cell 110. One of the two end memory cells 110 located at the ends of the string has the drain terminal connected to the source terminal of the drain select transistor 115d; the drain terminal of the drain select transistor 115d is connected to the corresponding bit line BL. Likewise, the other end memory cell 110 of the string has the source terminal connected to the drain terminal of the source select transistor 115s.

The gate terminals of the memory cells 110 in a same row of memory cells of the sector are connected to a corresponding word line WL. The gate terminals of the drain select transistors 115d belonging to a same row of drain select transistors of the sector 105 are all connected to a corresponding drain select line DSL; similarly, the gate terminals of the source select transistors 115s belonging to a same row of source select transistors 115s of the sector are all connected to a corresponding source select line SSL. The drain terminals of the drain select transistors 115d belonging to a same column of drain select transistors of the sector 105 are connected to a corresponding bit line BL. Conversely, the source terminals of all the source select transistors 115s in the sector 105 are connected to a common source line SL (which is typically kept at a reference voltage, or ground).

The memory cells 110 belonging to the same row are logically partitioned into memory pages. Assuming, merely by way of example, that each sector 105 includes 32K (i.e., 32,768) of bit lines BL, two memory pages of 2 KByte each for each word line WL are defined: if the bit lines are assigned an index represented by an integer, a first memory page consists for example of the memory cells 110 belonging to the bit lines having an even index, and a second memory page consists of the memory cells 110 belonging to the bit lines having an odd index. It is pointed out that the number of memory pages that are associated with a generic word line may be higher than two, particularly multiples of two, such as four, eight and so on; also, the size of the memory pages may be different.

For accessing the memory cells 110, an address code ADD is provided to the semiconductor device 100 through input/output pins ADD (in the present description, for the sake of simplicity, the input/output pins and the corresponding inputs will be denoted with the same references) belonging to an input/output interface 125. In particular, the input/output interface 125 includes all the components (for example, the above-mentioned input/output pins and buffers), which are used for interfacing the semiconductor device 100 with the outside environment.

The address code ADD is adapted to select a desired memory location (in a certain sector 105), for example for reading data or writing data from or into the addressed memory locations.

Input/output pins I/O, also belonging to the input/output interface 125 are provided for exchanging, with the outside environment, data DATA including data read from the flash memory during a reading operation, and data intended to be written thereinto; the exchanged data DATA comprises for example the recovering data, which are used for restoring the working environment of a computer.

The input/output pins I/O are also used for providing to the semiconductor memory device 100 command codes C which are adapted to control the operation of the semiconductor memory device 100, and more particularly for managing operating modes thereof. In the example at issue, the command codes C may comprise a command code HIBERNATION that is used for activating the hibernation operation, and two further command codes IDLE and SLEEP which are used for activating energy-saving operation modes in which all the unnecessary components of the semiconductor memory device 100 are shut down.

The address code ADD, the command codes C and the data DATA are fed to a command interface 130, which latches them in response of a group of activating signals CTL. The activating signals CTL are provided from the outside to the semiconductor memory device 100 through corresponding input pins CTL. In detail, the activating signals CTL comprise an address code latch enable signal AL which activates the latching of the address code ADD by the command interface 130, and a command code latch enable signal CL which activates the latching of the command codes C, also by the command interface 130. Moreover, the activating signals CTL may comprise other signals such as a write enable signal W, which when asserted enables the latching of the data DATA during the writing operation, and a read enable signal R, which, when asserted, controls the outputting of the data DATA during the reading operation.

The command interface 130 interfaces to a control logic unit 135 (such as a finite-state machine), which is used for timing the operations performed by operation of the semiconductor memory device 100. The control logic unit 135 provides a set of control signals (denoted as a whole with Sc) used for driving the various components of the semiconductor memory device 100. For example, the control signals Sc control the operation of a power managing circuit 140 which is adapted to provide biasing voltages used for performing operations such as read, program, erase and verify operations on the semiconductor memory device 100.

In particular, the power managing circuit 140 receives a supply voltage Vdd, and outputs different biasing voltages Vhv; the voltages Vhv are generally higher in absolute value than the supply voltage Vdd, (such as, 18V). For this purpose, the power managing circuit 140 includes a circuitry (for example, charge pumps and voltage level shifters) adapted to generate the biasing voltages Vhv from the supply voltage Vdd.

In response to the command code IDLE, the control signals Sc activate an operation mode referred to as IDLE MODE in which the charge pumps of the power managing unit 140 are activated, and generate the voltage needed for the generation of the high biasing voltages Vhv.

The latched address code ADD is supplied to an address decoder circuit 150. The address decoder circuit 150, in response to the received address code ADD, generates a row selection code ADD_ROW and a column selection code ADD_COL, used for selecting a memory page to be programmed during a program operation and to be read during a reading operation.

The row selection code ADD_ROW and the column selection code ADD_COL consist of respective string of bits.

In particular, the bits of the row selection code ADD_ROW are grouped in two fields, wherein a first field is used to determine which sector 105 has to be used during the operation of the semiconductor memory device 100, whereas the remaining, second field is used for determining which page has to be programmed within the selected sector.

The row selection code ADD_ROW is supplied to a plurality 152 of row selectors 155. In one embodiment of the invention, each row selector 155 is associated with a respective memory sector 105, however, in alternative embodiments of the invention it may be provided that a generic row selector is associated with two or more memory sectors.

In particular, each row selector 155, in response to the received row selection code ADD_ROW indicating that the corresponding sector is selected, accesses to the sector 105 and selects the word line WL of the desired page, as specified in the row selection code ADD_ROW, as well as the drain select line DSL and the source select line SSL of the corresponding strings.

The column selection code ADD_COL is supplied to a column selector 156. In one embodiment of the invention, each column selector 156 is associated with a respective memory sector 105, however, in alternative embodiments of the invention it may be provided that a generic column selector 156 is associated with two or more memory sectors 105. In particular, the column selector 156 comprises a column decoder 157, a page buffer 158 and a bit line selector 159. The column decoder 157, in response to the column selection code ADD_COL, connects the input/output pins I/O of the semiconductor memory device 100 to the proper sections of the page buffer 158. The page buffer 158 is exploited as a temporary storage unit during read/write operations on the memory cells 110 of the selected page. For example, the page buffer 158 may include a relatively high number of volatile storage elements (such as latch structures), adapted to properly biasing the bit lines of the memory sector depending on the operation which has to be performed on the flash memory. The page buffer 158 has a storage capability equal to the storage capability of the generic memory page (in the example at issue, 2 KBytes), and is thus adapted to manage the operations of reading the information stored in the memory cells of a selected memory page, or writing new information thereinto in one shot.

The memory page is selected by selecting a certain word line WL, and a certain packet of bit lines BL. The selection of the word line WL is performed by the row selector 155, while the selection of the packet of bit lines BL is performed by the bit line selector 159. Based on the column selection code ADD_COL, the bit line selector 159 selects the desired packet of bit lines BL and connects them to the page buffer 159.

In the example at issue, in which two memory pages of 2 KBytes exist for each word line WL, the packet of selected bit lines BL includes the 16384 bit lines with even index, or the 16384 bit lines with odd index.

Assuming that the semiconductor memory device 100 has eight input/output terminals I/O, when data DATA has to be written into the semiconductor memory 100, the page buffer 158 is replenished with the data DATA received serially in eight bits chunks (through the column decoder 157), and, after the page buffer 158 has been filled, the data DATA are written in parallel into the memory cells of a given, selected memory page.

Similar considerations apply when the data DATA are retrieved from the semiconductor memory device 100. The data read (in parallel) from the memory cells 110 of a selected page are temporarily stored in the page buffer 158, before being serially outputted in chunks of, for example, eight bits to the outside.

In operation, the semiconductor memory device 100 is put in an electronic system, which for example includes, inter alia, a data processor (not shown in the drawings). Just before a power down event, recovery data DATA are stored in the semiconductor memory device 100 so that, when the power supply returns, the working environment before the power down can be retrieved.

As discussed in the introduction of the present description, the time normally required by the flash memory for programming data is rather long, and might not allow saving the recovering data when a power down occurs. The reason of this resides in the fact that the programming of data is usually carried out in several steps, applying to the memory cells relatively light programming pulses to slightly change the memory cells' threshold voltage, and, after each pulse, verifying the cells' content.

According to an embodiment of the present invention, the semiconductor memory device 100 is adapted to implement a peculiar program operation, whereby the storage of the recovery data during a power down event requires a time significantly shorter compared to the normal programming time of the memory.

In particular, according to an embodiment of the present invention, the storage of the recovery data in case of a power down is initiated by sending to the semiconductor memory device 100 the command code HIBERNATION. Upon receiving this command code, the semiconductor memory device 100 understands that the data it will receive are recovery data that are to be quickly saved before the power supply is cut off. In response of the command code HIBERNATION the semiconductor memory device 100 starts the page program operation. During the operation, the recovery data DATA are fed to the semiconductor memory device 100 and are progressively loaded into the page buffer 158, in chunks of, for example, eight bits. The page buffer 158, through the bit line selector 159, selects one packet of bit lines corresponding to the selected page. The recovery data are programmed page after page, until all the recovering data DATA are saved.

Every time a page of recovering data has been fully loaded into the page buffer 158, that page of recovery data DATA is stored into a page of the semiconductor memory device 100.

In particular, considering two subsequent page program operations, the bit line selector and the row selector select respectively a packet of bit lines and one word line. According to an embodiment of the present invention, in order to speed up the programming of the recovering data, the word lines that are selected for programming different pages of recovering data are coupled to different memory cell strings. In other words, for each string of memory cells a single memory cell 110 is used for storing the recovery data DATA, leaving the remaining memory cells of the string in the erased state. The program operation of the memory cells of each string is performed by applying a relatively strong program pulse, adapted to guarantee that the threshold voltage of the selected memory cell in the string is brought to a value corresponding to the programmed state. No verify operation of the memory cell content is needed during the programming, and this allows substantially shortening the programming time associated to each page program operation, thereby the recovery data can be saved before the power supply is cut off. Indeed, when all the memory cells of a string are used to store data, it is important that, when a generic memory cell of the string is programmed, its threshold voltage does not exceed the passing voltage, otherwise when another memory cell of the string is accessed for reading its content, the former memory cell is not properly conductive. When, according to an embodiment of the present invention, only one memory cell in each string is used to store data, the remaining memory cells in the string are not be used to store the recovery data, and are left in the erased state; these other memory cells will thus not be accessed for reading their content; for this reason, it is not important that the threshold voltage of the memory cell used for storing the recovering data does not exceed, when the memory cell is programmed, the reading pass voltage.

The memory page where the recovery data will be stored is selected by selecting (and properly biasing) a given word line WL, and a packet of bit lines BL (for example, the bit lines with even index), which are then connected to the page buffer 158.

For programming the selected memory cell belonging to the selected string, a significantly high programming voltage (such as 18V) is applied to the memory cell control gate, while the control gates of the remaining memory cells of the string are driven by a programming pass voltage (such as, 10V), typically lower than the programming voltage, but sufficient to turn them on. The programming voltage and the programming pass voltage are provided by the power managing circuit 140. The bit line corresponding to the selected string is biased at a voltage that depends on the data to be programmed into the considered memory cell: if the data to be programmed is a "0" (by convention, corresponding to a memory cell with a positive threshold voltage), the bit line is biased at the reference voltage (such as 0V); if instead the memory cell is intended to store a "1" (which, by convention, corresponds to an erased memory cell, with a negative threshold voltage; thus, when the data to be stored is a "1", the corresponding memory cell is left in the original state), the bit line is biased at a higher voltage, such as the memory device supply voltage Vdd (for example, 3V). The other bit lines of the memory sector 105 (for example those having odd index) are brought to the supply voltage Vdd. The control terminal of the drain select transistor 115d corresponding to the selected string is driven by the supply voltage, thus in case the data to be programmed is a "0" the drain select transistor 115d is turned on, whereas in case the memory cell is intended to store a "1" the drain select transistor 115d is kept off. The source select transistor 115s receives at its control terminal the reference voltage, and thus remains turned off.

In detail, when a logic value equal to "0" has to be stored into the selected memory cell, the threshold voltage thereof has to be shifted towards higher values compared to the erased state (that corresponds to a logic "1"). For injecting electrons into the floating gate, as described above the row selector 155 biases the word line WL to which the selected memory cell 110 belongs to the high programming voltage, (18V); the remaining word lines WL controlling the control gates of the other memory cells of the same string are all brought to the programming passing voltage (10V) sufficiently high to ensure that these memory cells are turned on irrespective of their programming state, but sufficiently lower than the programming voltage not to cause spurious programming. All the other word lines WL (associated with different memory cells strings) are for example kept grounded. In such a way, the ground voltage at the selected bit line, propagating through the drain select transistor 115d and the channel of the memory cells 110 in the string, reaches the channel of the memory cell 110 to be programmed; here, the voltage difference of approximately 18V between the control gate and the channel of the selected memory cell is sufficient to cause electron tunnelling into the floating gate thereof.

When the data to be stored into the selected memory cell is a logic value equal to "1", its threshold voltage has to remain unchanged (under the assumption that the memory cell starts from an erased state). For this purpose, the voltage difference between the control gate and the channel of the selected memory cell is kept lower than the programming voltage, so as to be insufficient for causing a charge injection into the floating gate thereof. All the memory cells in the string are on, and, being the drain select transistor 115d off, the voltage of the channel of the selected memory cell is boosted toward relatively high values (such as, 7V) thanks to the capacitive coupling effect between the selected memory cell and the remaining memory cells of the string such that the voltage difference between the control gate and the channel of the selected memory cell is not sufficient to cause significant electron tunnelling, and the memory cell remains erased.

In this way, by applying to the selected bit lines the proper voltage, the cells 110 of the selected page to be brought to the logic value "0" are then programmed, while the other cells 110 are left unchanged (that is in the erased state).

As mentioned above, according to an embodiment of the present invention the program operation is performed applying the high programming voltage, as a single programming pulse, which is suitable for bringing the threshold voltage of the memory cells 110 of the selected page towards significantly high values. In such a way, the memory cells belonging to the selected memory page are certainly programmed after having applied the single programming pulse, and no verify operation is needed.

For example, it has been found that the time required for saving the recovering data from the page buffer 158 to the selected page ranges from 50 μs to 100 μs.

Using only one memory cell 110 for each string of the selected page for storing the recovery data is also particularly advantageous for retrieving from the memory the recovery data DATA so as to restore the working environment existing before the abrupt cut off of the supply voltage. For this purpose, a reading operation is performed for retrieving the recovery data DATA previously stored in the memory; in particular, for accessing to the memory cells 110 that store the recovery data DATA, the row selector 155 brings all the word lines of the selected string to the reference voltage (0V). This is possible because, according to an embodiment of the present invention, exception made for the single memory cell used to store the recovery data DATA, all the other memory cells of the generic string corresponding to the page to be read are always conductive (since they are deliberately left in the erased state). Thus, during the reading operation, the strings are conductive or not depending only on the state of the memory cell 110 storing the recovery data DATA.

Moreover, performing the reading operation using the reference voltage as the reading voltage applied to the word lines may provide a strong reduction of the spurious hot carrier generation that normally causes the soft programming of the unselected memory cells.

As a result, it is not necessary to adopt error-correcting-code techniques for correcting the read data DATA and the performance of the semiconductor device is improved.

A further advantage of the proposed solution consists of reduced power dissipation thereof.

For example, simulations show that when supply voltage Vdd ranges from 2V to 3.6V, during the IDLE mode the currents supplied to the semiconductor memory device 100 are lower than hundreds of μA (such as 100 μA), whereas during the HIBERNATION mode the currents supplied are lower than some mA (such as, 5 mA).

Figure 2:
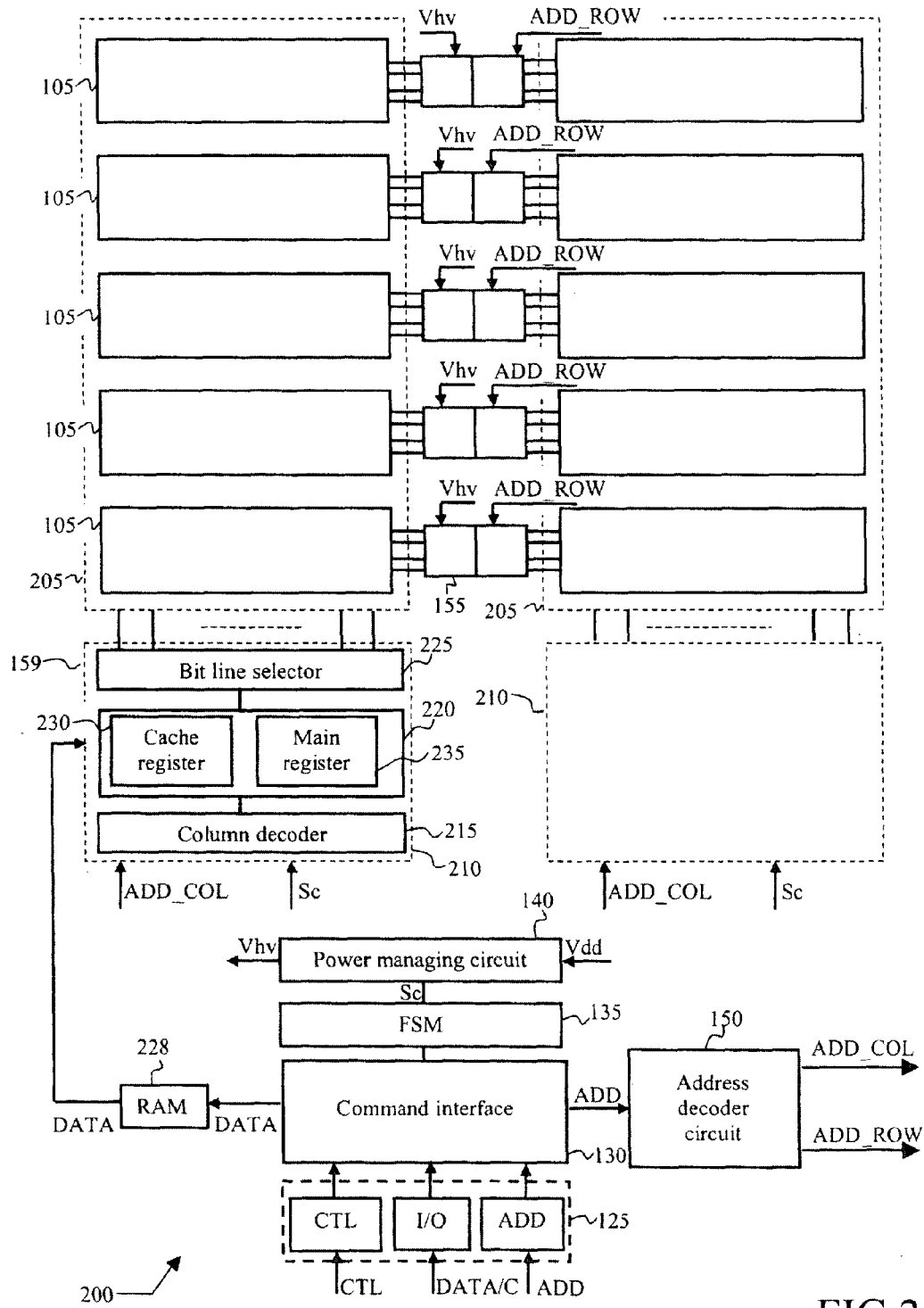
FIG. 2 schematically shows a block diagram of a semiconductor memory device according to another embodiment of the present invention.

Referring to FIG. 2, a non-volatile semiconductor memory device 200 according to another embodiment of the present invention is shown.

The semiconductor memory device 200 is integrated in a chip of semiconductor material, and includes one or more memory sector sets 205, each set 205 comprising a plurality of sectors 105. In the example at issue, each set 205 comprises five sectors 105, however the number of sectors 105 that are associated with the generic set 205 may be different (higher or lower) than five.

In particular, a column selector 210 is provided for each set 205. The column selector 210 comprises a column decoder 215, a page buffer 220 and a bit line selector 225. Similarly to what described above, the column decoder 215, in response to the column selection code ADD_COL, connects the input/output pins I/O of the semiconductor memory device 100 to the proper sections of the page buffer 220 which is exploited as a temporary storage unit during read/write operations on the memory cells 110 of the selected page.

The semiconductor memory device 200 includes a temporary storage, e.g. a buffer, such as a RAM (acronym for Random Access Memory) 228. The RAM 228 receives the data DATA from the command interface 130 and provides them to the page buffers 220.

The page buffer 220 is adapted to perform a program operation wherein the data DATA to be written into a selected memory page can be loaded into the page buffer while another memory page is still being written with data loaded in the page buffer at a previous time; in this way, the time necessary for programming in sequence different memory pages is reduced. For implementing this operation, the page buffer 220 includes two registers, namely a cache register 230 and a main register 235, each one controlled by corresponding control signals Sc. In detail, the cache register 230 is exploited for loading, from the RAM 228, data to be programmed into the memory cells 110 belonging to the selected page. The main register 235 is adapted to write into the selected memory cells 110 the data DATA received from the cache register 230. This structure permits programming a first memory page by means of the main register 235 while the data to be written into a second memory page are loaded into the cache register 230, thus speeding up the operation.

Similarly, when the data DATA have to be retrieved from the selected sector 105, the read data DATA are firstly loaded in the main register 235 and thereafter they are transferred into the cache register 230, which provides the data to the output, making them available to the outside environment. The output of the data DATA from the cache register 230 may occur simultaneously to the loading of further data DATA (from the sector 105) in the main register 235, so increasing the output data rate.

In particular, the cache register 230 and the main register 235 have a storage capability equal to the storage capability of the generic memory page (in the example at issue, 2 KBytes), and are thus adapted to manage the operations of reading the information stored in the memory cells of a selected memory page, or writing new information thereinto. In particular, the recovering data DATA can be transferred from the main register 235 to the selected page in one shot.

Figure 3:
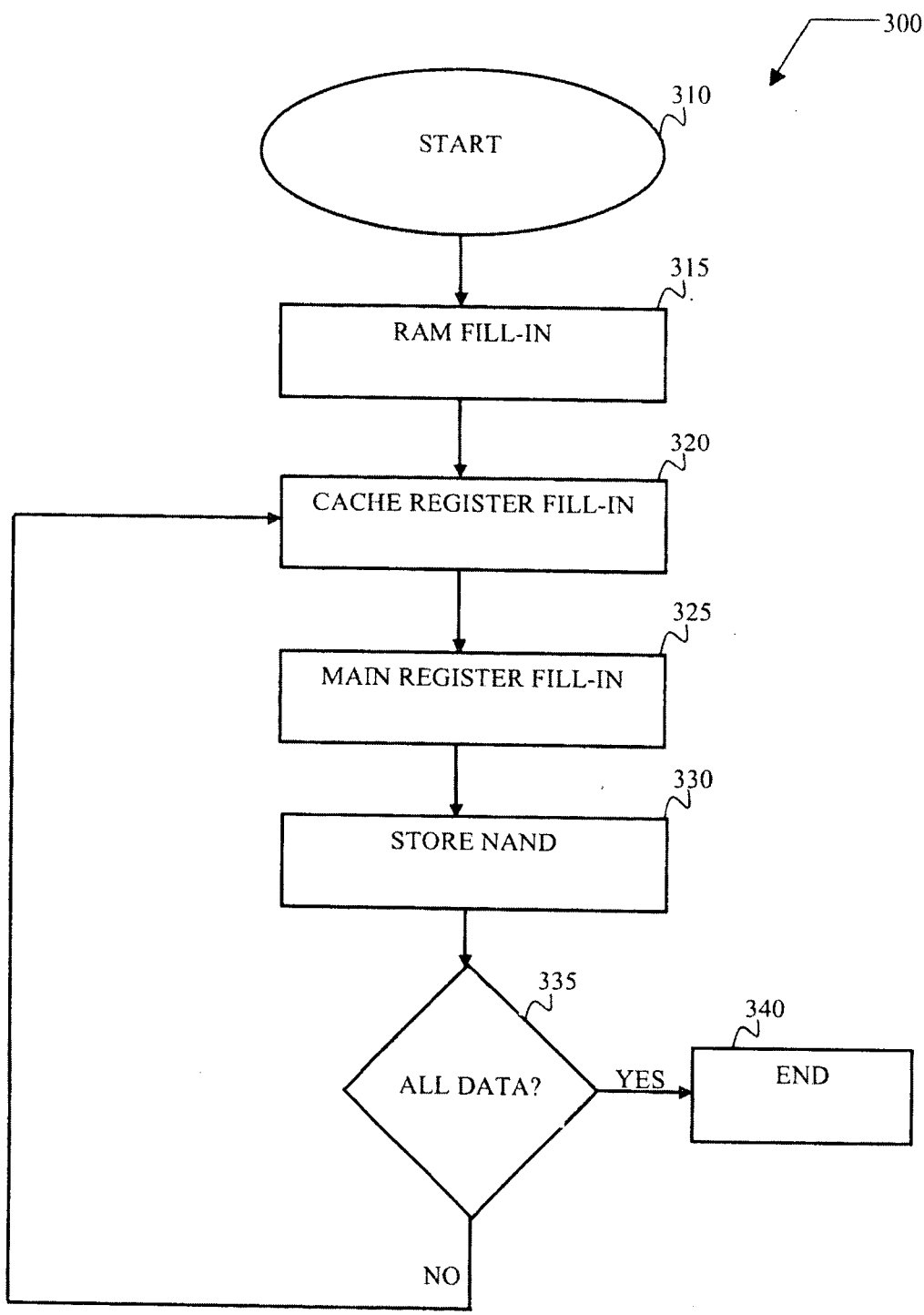
FIG. 3 shows, by way of a schematic flow-chart, a programming procedure of the memory device of FIG. 2 according to an embodiment of the present invention.

The operation of the semiconductor memory device 200 will be described referring to the schematic flowchart depicted in FIG. 3, where the main steps of a method 300 are shown of performing a hibernation operation during which the recovery data DATA are saved into the memory cells 110 belonging to a set 205 of FIG. 2.

The storage of the recovery data in case of a power down is initiated by sending to the semiconductor memory device 200 the command code HIBERNATION. Upon receiving this command code, the flash memory understands that the data it will receive are recovering data DATA that are to be quickly saved before the power supply is cut off. The recovery data DATA (coming from the command interface 130) that are received by the memory are sequentially sent to the RAM 228, and temporarily stored therein (block 315). Thereafter, a loop is entered, wherein a first portion of the recovery data DATA, which are stored in the RAM 228, is transferred into the cache register 230 (block 320). Then, the recovery data DATA are moved from the cache register 230 to the main register 235 (block 325). Afterwards, the recovery data DATA, which are in the main register 235, are written into the selected memory cells of the flash memory 200, so as to guarantee the retention of the recovering data DATA also during a power down event (block 330).

In particular, when a complete page of data has been loaded into the main register 235, the recovery data DATA are written into a selected memory page of the flash memory 200. In particular, considering two different page program operations, the bit line selector and the row selector select respectively a packet of bit lines and one word line coupled to different memory cell strings. As in the previous embodiment, for each memory cells string a single memory cell 110 is used for storing the recovering data DATA, leaving in the erased state the remaining memory cells of the string. Also in this case, the program operation of the memory cells of each string is performed by applying a relatively strong programming pulse, adapted to guarantee that the threshold voltage of the selected memory cell 110 is brought to the value corresponding to the programmed state. In such a way, no verify operation of the memory cell content is needed so shortening the programming time associated to each page program.

The above operations are iterated until all the recovering data DATA temporally retained by of the RAM 228 have been written into the Flash memory 200 (block 335).

In other words, when the amount of recovering data DATA exceeds the storage capability of the cache register 230, i.e. one memory page, the data are written in a number of iterations (which in particular depends on a ratio between a total number of bytes of the recovery DATA and the storage capability of the cache register 230). One memory page of the selected sector 105 in the set 205 is used to store the recovery data, and the memory cells belonging to the other memory pages are left in the erased state. When a memory cell 110 of the string is already used for storing the recovery data DATA, the string is not more utilizable for storing further recovering data DATA.

In detail, a number of iterations N for writing the recovery data DATA into the flash memory cells depends on the total number of bytes of the recovery data DATA to be stored, the storage capability of the RAM 228 and of the page buffer 220.

In particular, the following relation holds:

$$N=(TOTs/RAMs)*(RAMs/PBs)=TOTs/PBs$$

in which the term TOTs indicates the total number of the bytes forming the recovery data DATA to be stored, the term RAMs indicates the number of bytes stored in the RAM 228, and the term PBs indicates the size in bytes of the registers 230 and 235.

The time required for storing the data DATA depends on the number of iterations and more in particular on the predetermined number N. In particular, the time required by the semiconductor device 200 for performing the hibernation operation follows the following relation:

$$T=(N)*Ts$$

where in the term T indicates the total time required for storing the recovery data DATA into the flash memory 200, the term Ts indicates the time required for transferring the data DATA from the main register 235 to the selected sector 105 by using for the storing operation one only memory cell for each string.

For example, in case Ts=50 us and N=2, the saving of the recovery data DATA requires approximately 100 μs.

It should be noted that the semiconductor device 200, having only one column selector 210 for each set 205, allows reducing the semiconductor area necessary for integrating the device, compared to solutions wherein a column selector is provided for each sector 105.

It should be noted that the semiconductor memory devices 100 and 200 according to the embodiments of the present invention can be implemented as stand-alone devices.

The fast write functionality according to the embodiments of the invention herein described can be implemented in conventional NAND Flash memory devices, making them adapted to be used as NVRAMs for performing the fast data saving during the system power down.

Figure 4:
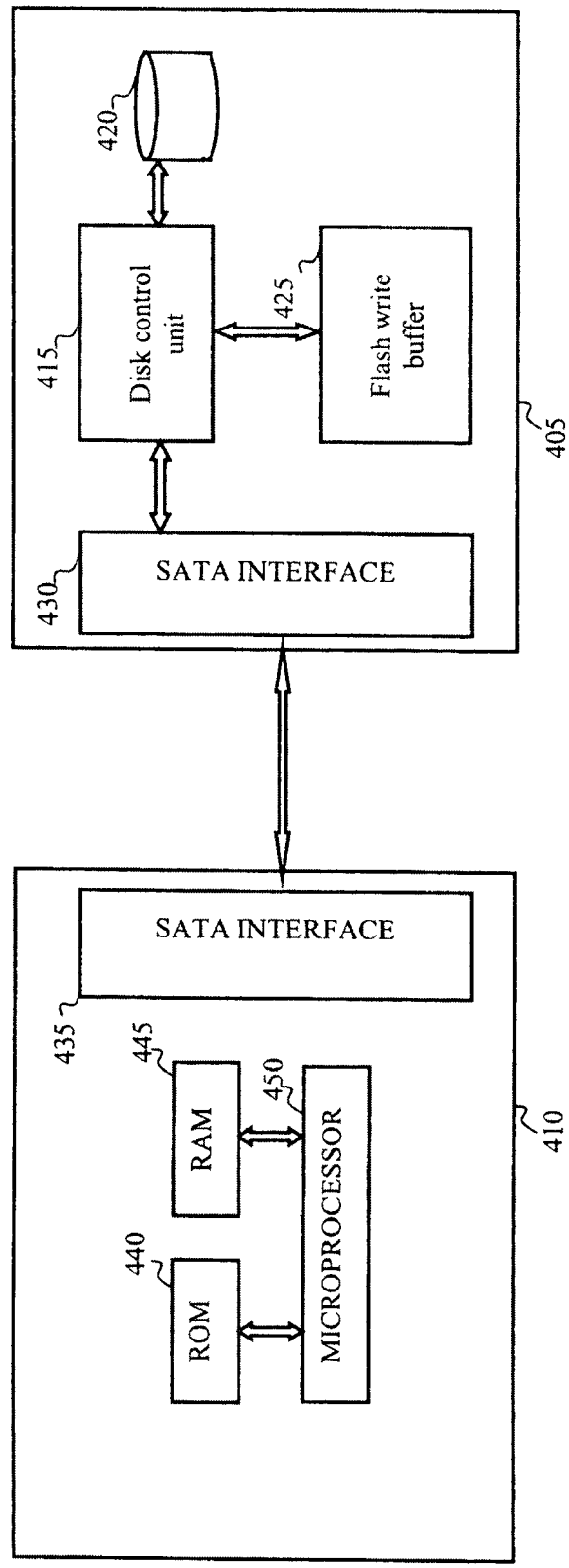
FIG. 4 shows an exemplary electronic system wherein the semiconductor device according to an embodiment of the present invention is advantageously employed.

Although applicable in general to any kind of electronic system, an embodiment of the present invention is in particular applicable to electronic systems like that employed by the personal computers, particularly albeit not (imitatively hard disk drives as schematically shown in FIG. 4. In particular, an exemplary scheme of an electronic system 400 including a hard disk drive 405 and a motherboard 410 limited to some blocks relevant for the understanding of an embodiment of the present invention is shown.

The hard disk drive 405 is used for the long-term retention of the data of a personal computer. The hard disk drive 405 comprises a disk control unit 415 which interfaces to a ferromagnetic storage support, such as glass platters covered by a ferromagnetic material and a plurality of heads adapted for writing/reading the data (indicated in the whole as 420) on the platters. According to an embodiment of the present invention, a NAND Flash memory featuring a fast write functionality as described in the foregoing is used to form a flash write buffer 425 in the hard disk drive 405, interfacing the control unit 415. The hard disk drive 405 and the motherboard 410 communicate with each other through corresponding interface circuits (such as a Serial Advanced Technology Attachment interface) 430 and 435. Moreover, the motherboard 410 includes all the components, such as a ROM memory 440, a RAM memory 445 and a microprocessor 450 which are used for managing the operations, which are required for the personal computer.

In the example at issue, the flash write buffer 425 is used as a cache non-volatile memory device. In other words, when data have to be stored into the hard disk 405, the data are firstly quickly stored into the flash write buffer 425, and they are then are transferred to the ferromagnetic support 420.

In such application, the proposed semiconductor devices are employed for reducing the power consumption and thus to guarantee better performance of the electronic system in which they are embedded. Indeed, thanks to the fact that the platters of the ferro-magnetic support 420 are off and the heads are parked during the programming of the flash write buffer 425, it is possible to reduce the total power consumption during the operation of the hard disk drive 405. In particular, it has been found that by using the flash write buffer 425 the reduction of the power consumption is approximately of the order of 87% with respect to the conventional hard disk drive using only the ferro-magnetic support for permanently storing the data.

Moreover, with the platters of the ferro-magnetic support off and the heads parked during the most of the time, the ferro-magnetic support is less likely to be damaged.

From the foregoing it will be appreciated that, although specific embodiments of the invention have been described herein for purposes of illustration, various modifications may be made without deviating from the spirit and scope of the invention.

What is claimed is:

1. A memory device comprising:
   a data node;
   a reference node;
   word lines;
   a group of non-volatile memory cells serially coupled between the data node and the reference node, the group of non-volatile memory cells coupled to the word lines such that each non-volatile memory cell of the group of non-volatile memory cells is coupled to one of the word lines; and a control circuit operable to apply a same voltage to the word lines during retrieving of data from a selected non-volatile memory cell of the group of non-volatile memory.

2. The memory device of claim 1, wherein the voltage comprises a reference voltage.

3. The memory device of claim 1, wherein a value of the voltage is zero.

4. The memory device of claim 1, wherein the data node comprises a bit line.

5. The memory device of claim 1, wherein the reference node comprises a source line.

6. A memory device comprising:

a data node;

a source node;

a group of non-volatile memory cells serially coupled between the data node and the reference node, the group of non-volatile memory cells coupled to word lines such that each non-volatile memory cell of the group of non-volatile memory cells is coupled to one of the word lines; and a control circuit operable to store data in a selected non-volatile memory cell of the group of non-volatile memory cells, to perform no verification of a state of the selected non-volatile memory cell after the data is stored in the selected non-volatile memory cell, and to apply a same voltage to the word lines during retrieving of the data from a selected non-volatile memory cell.

7. The memory device of claim 6, wherein the control circuit is operable to store the data in the selected non-volatile memory cell such that after the data is stored in the selected non-volatile memory cell, the selected non-volatile memory cell has a state different from a state of other non-volatile memory cells in the group of non-volatile memory cells.

8. The memory device of claim 7, wherein the state of the other non-volatile memory cells in the group of non-volatile memory cells comprises an erase state.

9. The memory device of claim 6, wherein the control circuit is operable to store the data in the selected non-volatile memory cell in anticipation of the memory device transitioning from a first operating mode to a second operating mode.

10. The memory device of claim 9, wherein the first operating mode comprises a full-power mode and the second operating mode comprises a less than full-power mode.

11. The memory device of claim 6, wherein the control circuit is operable to use a single programming pulse to store the data in the selected non-volatile memory cell.

12. A method comprising:

storing data in a selected non-volatile memory cell of a group of non-volatile memory cells serially coupled between a data node and a source node, each non-volatile memory cell of the group of non-volatile memory cells coupled to a word line among word lines coupled to the group of non-volatile memory cells; and applying a same voltage to the word lines coupled to the group of non-volatile memory cells during retrieving of the data from the selected non-volatile memory cell.

13. The method of claim 12, wherein storing data in the selected non-volatile memory cell is performed such that the selected non-volatile memory cell has a state different from a state of other non-volatile memory cells in the group of non-volatile memory cells.

14. The method of claim 13, wherein the state of the other non-volatile memory cells in the group of non-volatile memory cells comprises an erase state.

15. The method of claim 12, wherein storing data in the selected non-volatile memory cell is performed using a single programming pulse.

16. The method of claim 12, wherein storing data in the selected non-volatile memory cell is performed in anticipation of a memory device transitioning from a first operating mode to a second operating mode, the memory device comprising the group of non-volatile memory cells.

17. The method of claim 16, wherein the first operating mode comprises a full-power mode and the second operating mode comprises a less than full-power mode.

18. The method of claim 12, wherein the voltage comprises a reference voltage.

19. The method of claim 12, wherein a value of the voltage is zero.

20. The method of claim 12, wherein the data node comprises a bit line.

* * * * *